(12) United States Patent
Fan et al.

(10) Patent No.: US 7,154,284 B2
(45) Date of Patent: Dec. 26, 2006

(54) INTEGRATED CIRCUIT PROBE CARD

(75) Inventors: Horng-Kuang Fan, Chu-Pei (TW); Hendra Sudin, Chu-Pei (TW)

(73) Assignee: MJC Probe Incorporation (TW)

( * ) Notice: Subject to any disclaimer, the term of this patent is extended or adjusted under 35 U.S.C. 154(b) by 0 days.

(21) Appl. No.: 10/905,482

(22) Filed: Jan. 6, 2005

(65) Prior Publication Data

US 2006/0022686 A1    Feb. 2, 2006

(30) Foreign Application Priority Data

Jul. 28, 2004    (TW) .............................. 93122513 A

(51) Int. Cl.
*G01R 31/02*    (2006.01)
(52) U.S. Cl. ...................... 324/754; 324/757
(58) Field of Classification Search ..................... None
See application file for complete search history.

(56) References Cited

U.S. PATENT DOCUMENTS

| | | | | |
|---|---|---|---|---|
| 3,866,119 | A | * | 2/1975 | Ardezzone et al. ......... 324/754 |
| 5,329,226 | A | * | 7/1994 | Monnet et al. .......... 324/158.1 |
| 5,355,080 | A | * | 10/1994 | Sato et al. .................. 324/761 |
| 5,459,407 | A | * | 10/1995 | Nickerson et al. .......... 324/756 |
| 5,949,239 | A | * | 9/1999 | Rezvani et al. ............. 324/754 |
| 5,959,461 | A | * | 9/1999 | Brown et al. ................ 324/765 |
| 5,974,662 | A | * | 11/1999 | Eldridge et al. .............. 29/842 |
| 6,002,426 | A | * | 12/1999 | Back et al. .................... 348/87 |
| 6,246,247 | B1 | | 6/2001 | Eldridge |
| 6,501,289 | B1 | * | 12/2002 | Takekoshi .................... 324/758 |
| 6,586,956 | B1 | | 7/2003 | Aldaz |
| 6,674,296 | B1 | * | 1/2004 | Duckworth et al. ......... 324/758 |
| 2005/0174133 | A1 | * | 8/2005 | Lou et al. ................... 324/754 |
| 2005/0280427 | A1 | * | 12/2005 | Lou et al. ................... 324/754 |
| 2006/0186908 | A1 | * | 8/2006 | Lou et al. ................... 324/758 |

FOREIGN PATENT DOCUMENTS

| JP | 63244640 A | * | 10/1988 |
|---|---|---|---|
| JP | 01053428 A | * | 3/1989 |
| JP | 2005291724 A | * | 10/2005 |

* cited by examiner

*Primary Examiner*—Paresh Patel
(74) *Attorney, Agent, or Firm*—Connolly Bove Lodge & Hutz, LLP; Larry Hume

(57) ABSTRACT

The probe card comprises a primary circuit board with a plurality of signal contacts, a probe assembly including a plurality of probes electrically connected to the signal contact and an adjusting assembly for adjusting the coplanarity between the probe assembly and a device under test. The adjusting assembly comprises a groove plate with a plurality of grooves, a wedge positioned in the groove, at least one adjusting pin connecting the wedge and the probe assembly and at least one screw positioned at one side of the wedge. The wedge comprises an inclined surface, and one end of the adjusting pin contacts the inclined surface of the wedge and the other end contacts the probe assembly. The circuit probe card moves the wedge laterally to further move the adjusting pin upwards and downwards, so that to the coplanarity between the probe assembly and the device under test can be adjusted.

24 Claims, 13 Drawing Sheets

INTEGRATED CIRCUIT PROBE CARD

BACKGROUND OF THE INVENTION (A) Field of the Invention

The present invention relates to an integrated circuit probe card with a planarity adjusting mechanism, and more particularly to an integrated circuit probe card with a planarity adjusting mechanism capable of adjusting the coplanarity between an integrated circuit device under test and a probe assembly including several probes.

(B) Description of the Related Art

Generally, it is necessary to test the electrical characteristic of integrated circuit devices on the wafer level for checking whether the integrated circuit device satisfies the product specification. Integrated circuit device with electrical characteristic satisfying the specification will be selected to carry on the subsequent packaging process, and other devices will be discarded to avoid additional packaging cost. Another electrical property test will be performed on the integrated circuit device after the packaging process is completed and finally to sieve out the disqualified devices to increase the product yield. As a result, several testing processes need to be performed during the fabrication process of an integrated circuit device.

FIG. 1 is a schematic cross-sectional view of an integrated circuit probe card 10 according to the prior art. As shown in FIG. 1, the integrated circuit probe card 10 using three-piece configuration consists of a printed circuit board 20, a ceramic substrate 30 and a probe contactor 40. The printed circuit board 20 comprises a plurality of pads 22 and a plurality of conductive wires 24 electrically connecting the pads 22 to a test machine (not shown in FIG. 1). The probe contactor 40 comprises a plurality of probes 42, which is used to contact a device under test (DUT) 52, such as an integrated circuit device, on a wafer 50 and acquire the electrical properties thereof.

During the probing process, the plane 44 consisting of tips of the probes 42 must be substantially coplanar to another plane 56 consisting of pads 54 of the device under test 52 so that the probes 42 can apply contact force uniformly to corresponding pads 54 on the device under test 52 to pierce the oxide thereon. If the plane 44 is inclined to the plane 56 rather than parallel to the plane 56, some of the probes 42 can contact corresponding pads 54, while the other probes 42 cannot establish physical contact and cannot form electrical connection. As a result, it is impossible to measure the electrical properties of the device under test 52 accurately.

Whether or not the plane 44 is parallel to the device under test 52 primarily depends on the length difference between the probes 42 and the planar orientation of the probe holder 40. Before the probing process is conducted, the prior art planarizes the tip of the probes 42 by a sanding technique. However, as the design rule shrinks to small size and high density, the arrangement of the pad 54 becomes denser, and the arrangement of the probe 42 for contacting the pad 54 must be shrunk to small pitch and high density accordingly. The probe 42 with a shrunk arrangement tends to be abrasively worn off, it is because of sanding process may introduce a large process variation errors; therefore, the sanding technology for planarizing the tip of the probe 42 cannot be applied to the probe 42 arranged with the shrunk design rule. Currently, an elastic material is positioned between the probe holder 40 and the circuit board 20, and the elasticity of the elastic material can accommodate plane difference originating from the length difference of the probes 42.

In addition, the planarity of the probe holder 40 must be taken into account except for the difference in the lengths of the probes 42 so as to allow the probes 42 to apply force uniformly on the pads 54 of the device under test 52. The prior art uses a differential screw to adjust the planarity of the probe holder 40. U.S. Pat. No. 6,586,956 B2 discloses a test system with an adjustable plane mechanism, which adjusts the planarity of the probe holder by the fine adjustment of differential screws. However, the disclosure of U.S. Pat. No. 6,586,956 B2 can only fine-adjust the planarity of the probe holder entirely, and the contact force applied by each probe on the corresponding pad cannot be adjusted individually if there is difference between the lengths of the probes.

U.S. Pat. No. 6,246,247 discloses a probe card assembly that also uses a differential screw to finely adjust the planarity of the space transformer of the probe card. Furthermore, U.S. Pat. No. 6,246,247 also discloses an elastic connector directly soldered on the assembly, which contains a soft core and a hard shell cladding the soft core. When the differential screws are used to fine-adjust the planarity of the space transformer of the probe card assembly, the electrical connection between the parts of the probe card assembly can still be ensured by the elasticity of the elastic connector.

However, the above-mentioned prior art references are complicated and inconvenient in adjusting the coplanarity between the probe card and the device under test, therefore it is necessary to improve the design of the prior art.

SUMMARY OF THE INVENTION

The objective of the present invention is to provide an integrated circuit probe card with a planarity adjusting mechanism capable of adjusting the coplanarity between an integrated circuit device under test and a probe assembly including a plurality of probes.

In order to achieve the above-mentioned objective, and avoid the problems of the prior art, the present invention discloses an integrated circuit probe card with a planarity adjusting mechanism capable of adjusting the coplanarity between an integrated circuit device under test and a probe assembly including several probes. The probe card comprises a primary circuit board with a plurality of signal contacts, a probe assembly electrically connected to the signal contact and an adjusting assembly for adjusting the coplanarity between the probe assembly and an integrated circuit device under test. The probe assembly comprises a probe contactor including a plurality of probes, a fixing plate with a plurality of openings and an elastic pin positioned in the opening. The probe of the probe contactor is used to acquire electrical properties of the device under test, and the elastic pin is electrically connected to the probe of the probe contactor and the signal contact of the primary circuit board. The adjusting assembly comprises a groove plate with a plurality of grooves, a wedge positioned in the groove, at least one adjusting pin with two ends contacting the wedge and the probe assembly and at least one screw contacting one side of the wedge. The wedge comprises an inclined surface, and one end of the adjusting pin contacts the inclined surface of the wedge and the other end contacts the probe assembly.

Compared with prior art, the present integrated circuit probe card rotates the screw contacting the side of the wedge to move the wedge laterally, and the inclined surface of the wedge moves the adjusting pin upwards and downwards to further adjust the coplanarity between the probe assembly and the device under test. The present invention can adjust the coplanarity easily by the wedges with an appropriate inclined surface and screws with an appropriate pitch. In addition, different from the prior art using the vertical movement of differential screws to adjust the coplanarity, the present invention adjusts the coplanarity between the probe assembly and the device under test by the lateral movement of the wedge through the rotation of the screw. Furthermore, the contact force (F) transmitted to the probe by the device under test is transferred to the inclined surface of the wedge, and consequently renders the direction of the friction force (f) generated by the vertical component force ($F_v$) of the force (F) on the inclined surface, is opposite to that of the horizontal component force ($F_h$) of the contact force (F). Consequently, a certain magnitude of friction force associated with a coefficient of friction will be generated on the inclined surface, thereafter to counteract the horizontal component force ($F_h$) and physically lock the lateral position of the adjusting pin automatically, so that the coplanarity between the probe assembly and the device under test will be maintained.

BRIEF DESCRIPTION OF THE DRAWINGS

Other objectives and advantages of the present invention will become apparent upon reading the following descriptions and upon reference to the accompanying drawings in which.

DETAILED DESCRIPTION OF THE INVENTION

Figure 1:
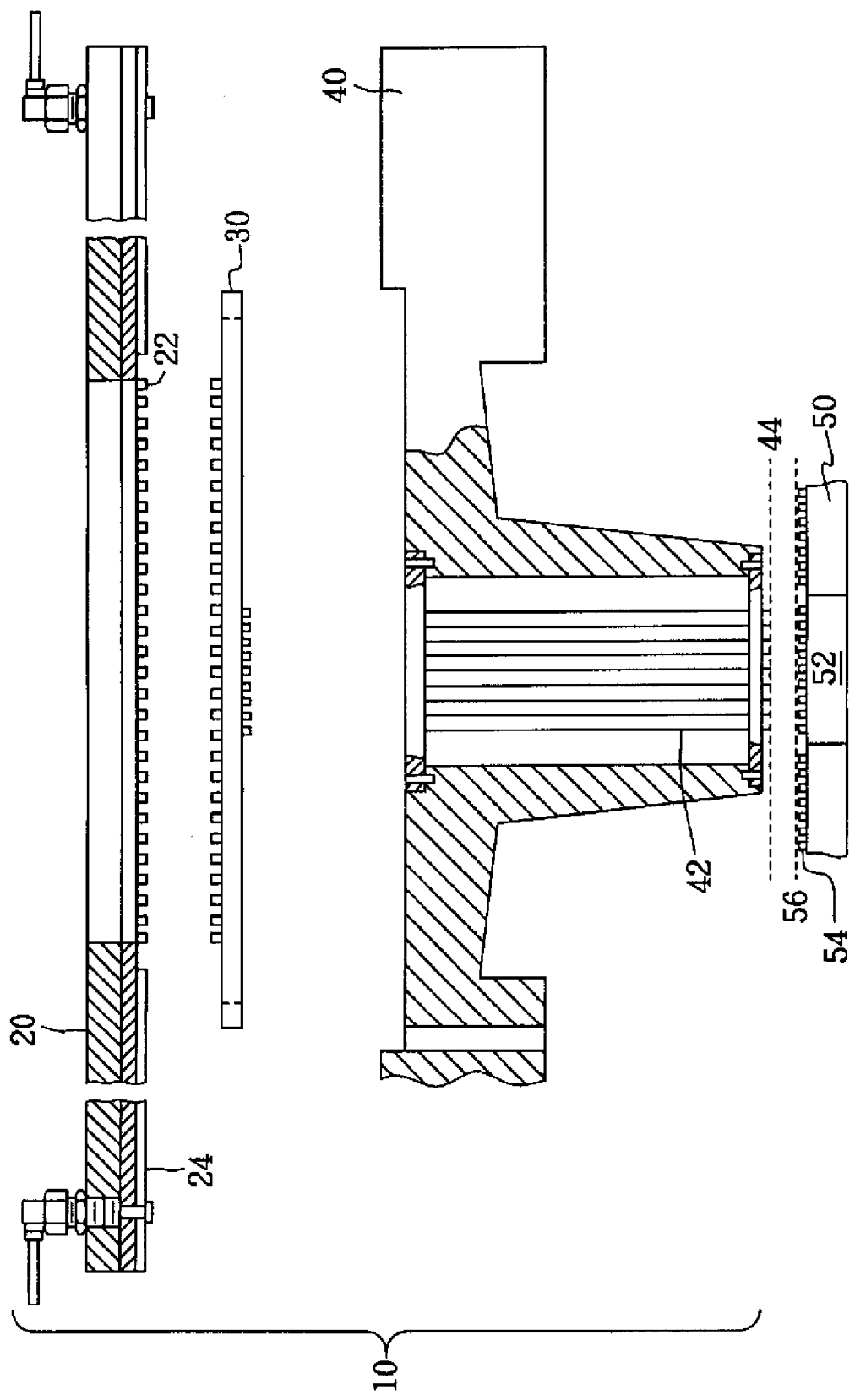
FIG. 1 is a cross-sectional view of an integrated circuit probe card according to the prior art.
Figure 2:
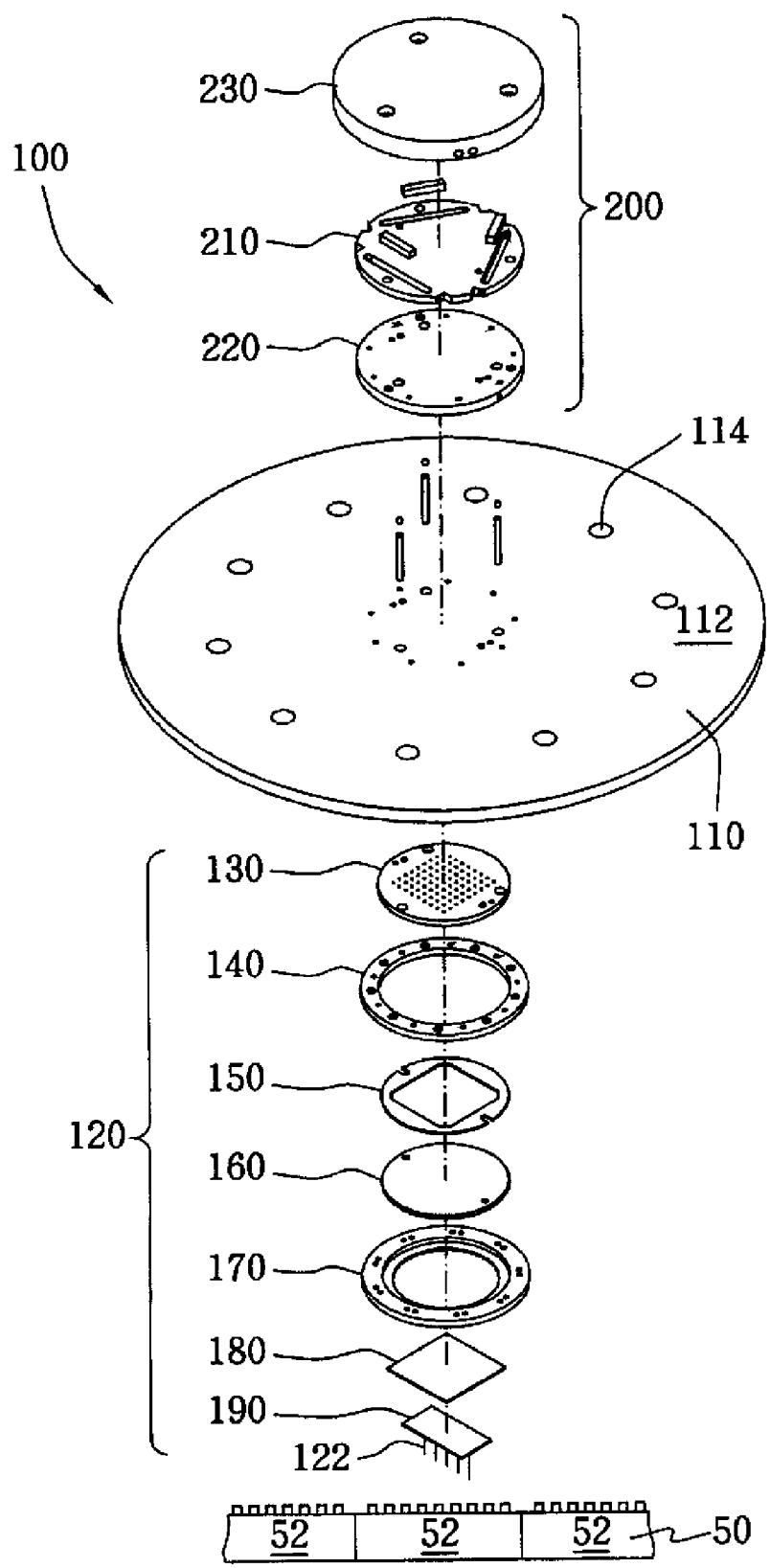
FIG. 2 illustrates an integrated circuit probe card according the first embodiment of the present invention.

FIG. 2 illustrates an integrated circuit probe card 100 according to the first embodiment of the present invention. As shown in FIG. 2, the integrated circuit probe card 100 comprises a primary circuit board 110, a probe assembly 120 including a plurality of probes 122 and an adjusting assembly 200 for adjusting the coplanarity between the probe assembly 120 and a wafer 50 including several integrated circuit devices 52. The primary circuit board 110 comprises a plurality of testing contacts 114 positioned on the upper surface 112 for electrical connecting a test machine (not shown in FIG. 2). The adjusting assembly 200 comprises an upper cover 230, a groove plate 210 and a guiding plate 220. The probe assembly 120 comprises an elastic connector 130, a spacer 140, a stress dispersion plate 150, an interface circuit board 160, a bottom cover 170, a space transformer 180 and a probe contactor 190.

Figure 3:
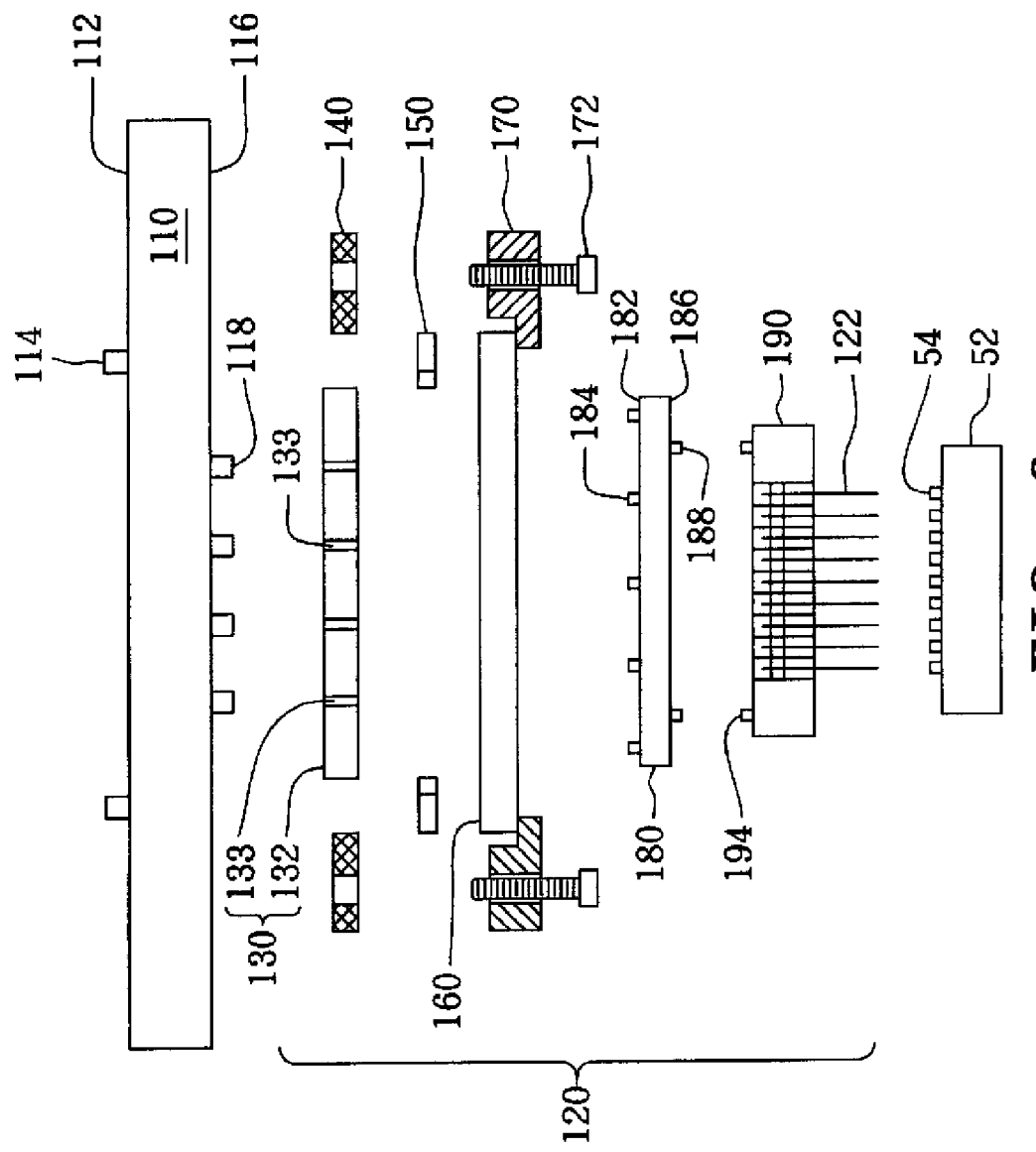
FIG. 3 is a cross-sectional view of a probe assembly according to the present invention.

FIG. 3 is a cross-sectional view of the probe assembly 120 according to the present invention. As shown in FIG. 3, the primary circuit board 110 comprises a plurality of signal contacts 118 positioned on the bottom surface 116. The elastic connector 130 comprises a fixing plate 132 with a plurality of openings 133 and elastic pins 134 (shown in FIG. 4) positioned in the openings 133, respectively. The spacer 140 is fixed on the bottom surface 116 of the primary circuit board 110, and the elastic connector 130 is positioned inside the spacer 140.

Figure 4:
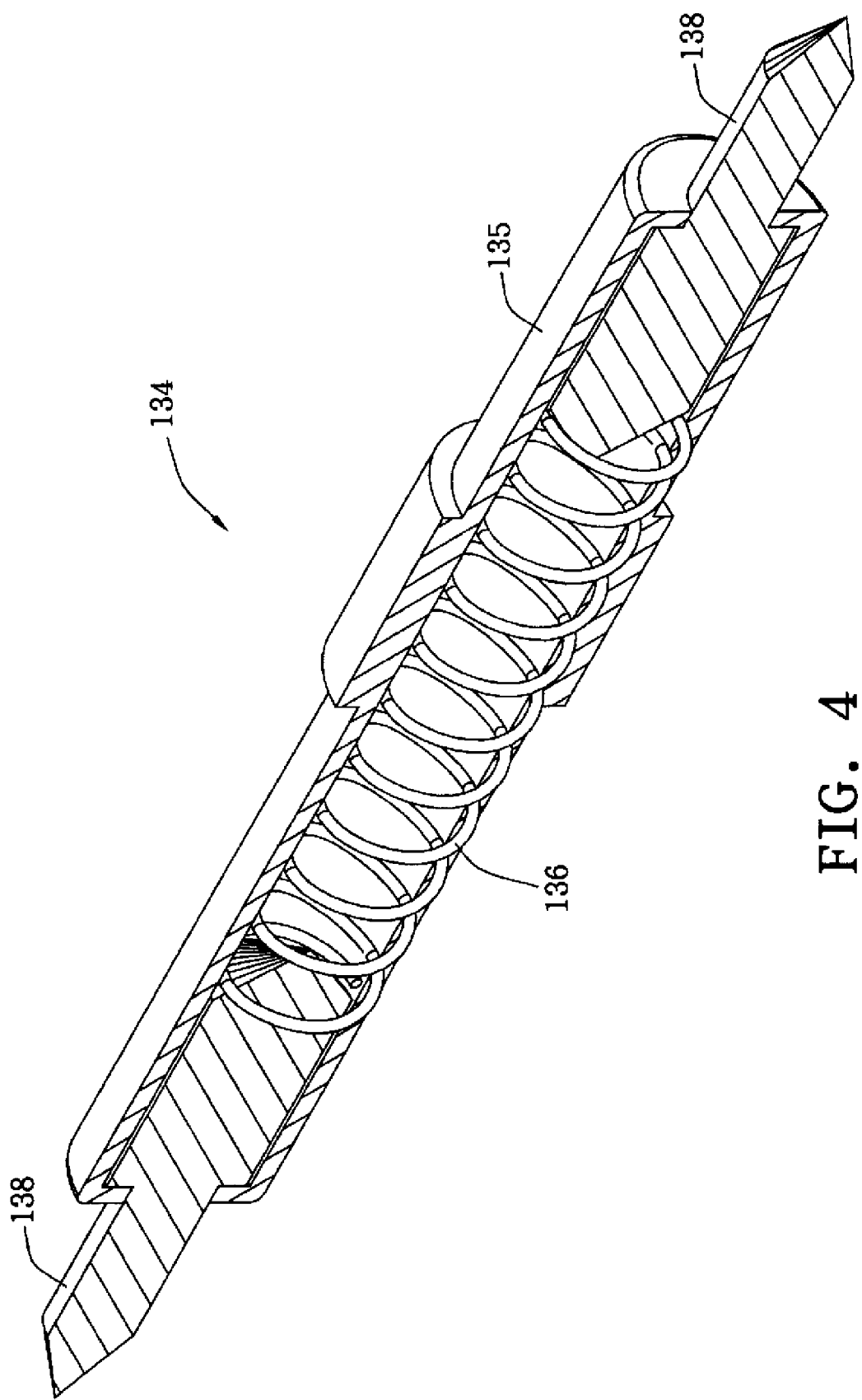
FIG. 4 illustrates an elastic pin according to the present invention.

FIG. 4 illustrates the elastic pin 134 according to the present invention. As shown in FIG. 4, the elastic pin 134 comprises a housing 135, a spring 136 positioned in the housing 135 and two connecting pin 138 positioned at the two ends of the spring 136. One of the two connecting pins 138 is connected to the signal contact 118 of the primary circuit board 110, while the other connecting pin 138 is connected to the interface circuit board 160.

Referring back to FIG. 3, the space transformer 180 comprises a plurality of upper contacts (upper connecting sites) 184 positioned on the upper surface 182 and a plurality of bottom contacts (bottom connecting sites) 188 positioned on the bottom surface 186. The interface circuit board 160 connects the upper contact 184 of the space transformer 180 and the elastic pin 134 electrically with its internal conductive circuit (not shown). The bottom cover 170, which can be fixed on the spacer 140 by screws 172, supports the interface circuit board 160, the stress dispersion plate 150 and the elastic connector 130. The space transformer 180 can be solder joined on the bottom surface of interface circuit board 160 via reflow process. Consequently, the probe assembly 120 can be fixed on the bottom surface 116 of the primary circuit board 110.

The space transformer 180 connects the upper contact 184 and the bottom contact 188 electrically via internal conductive circuit (not shown). The probe contactor 190 comprises a plurality of probes 122 to acquire electrical properties of the integrated circuit device under test 52. The pitch between the probes 122 is substantially equal to that between pads 54 on the device under test 52, and the pad 194 on the probe contactor 190 is connected to the bottom contact 188 of the space transformer 180 electrically. The pitch between the upper contacts 184 of the space transformer 180 is greater than that of the probes 122.

Figure 5:
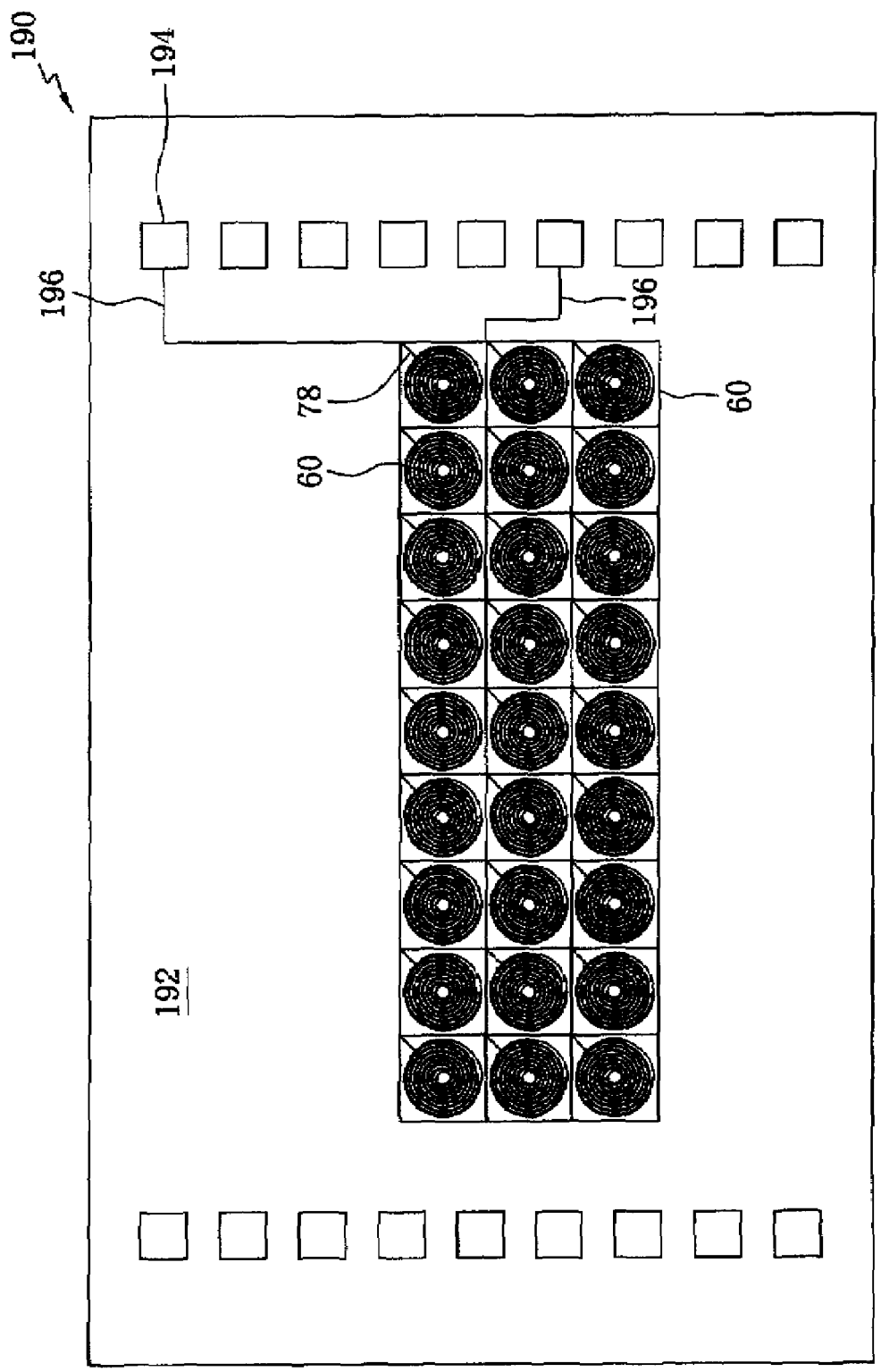
FIG. 5 illustrates a probe contactor according to the present invention.

FIG. 5 illustrates the probe contactor 190 according to the present invention. As shown in FIG. 5, the probe contactor 190 comprises a plurality of probe devices 60, a plurality of pads 194 positioned on the upper surface 192 and a plurality of conductors 196 connecting the probe device 60 and the pad 194 electrically (for the sake of clearness, FIG. 5 only shows two conductors 196). The arrangement of the probe device 60 corresponds to the pad 54 on the device under test 52. For example, the probe devices 60 are arranged in an array of 9×3.

Figure 6:
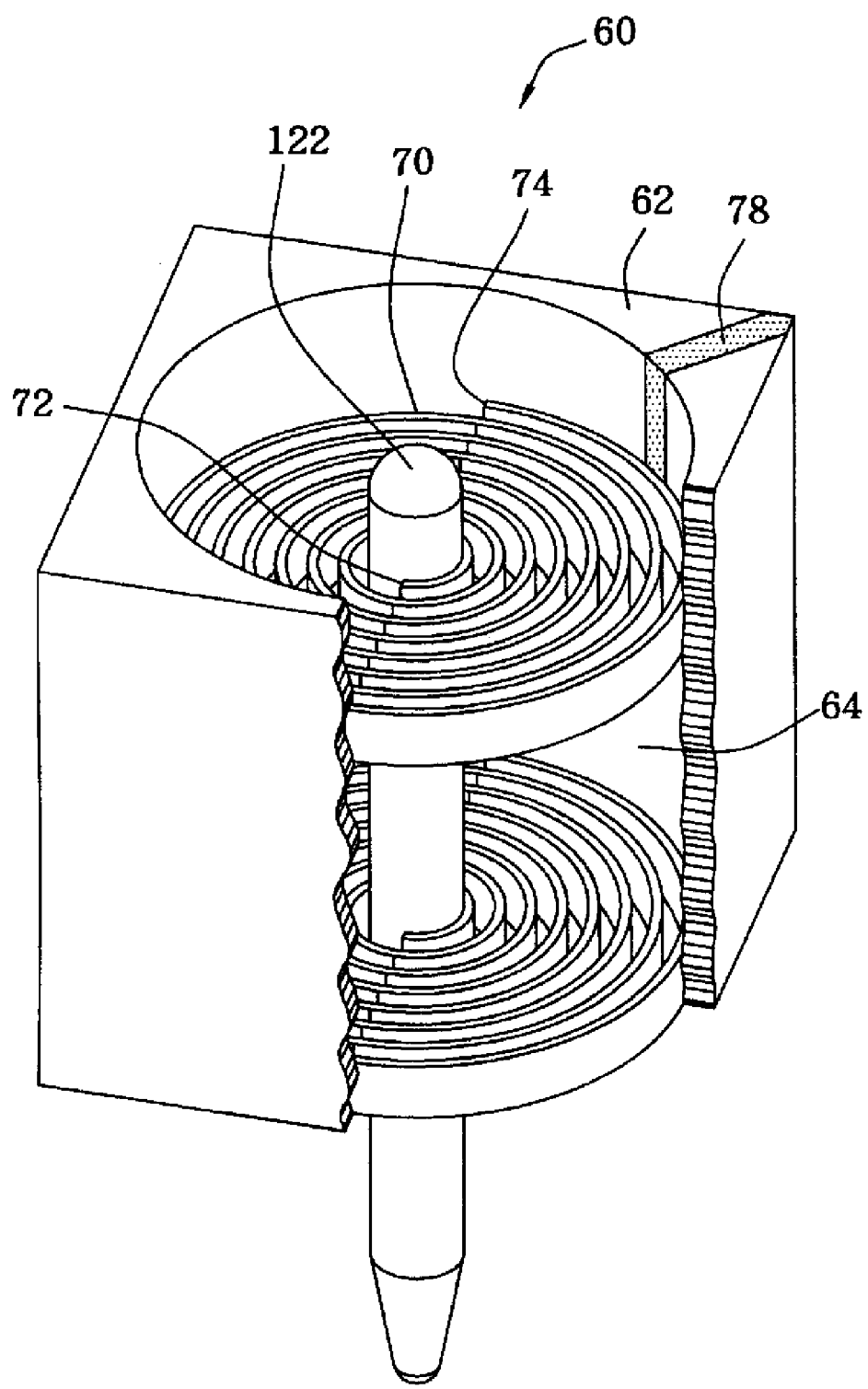
FIG. 6 illustrates a probe device according to the present invention.

FIG. 6 illustrates the probe device 60 according to the present invention. As shown in FIG. 6, the probe device 60 comprises an insulative body 62 with a circular opening 64, two supporters 70 positioned in the opening 64, a probe 122 positioned in the supporter 70 and an electric signal conductor 78 positioned in the insulative body 62 and electrically connected to the supporter 70. The supporter 70 is a helical spring with its inner end 72 connected to the probe 26 and its outer end 74 connected to electric signal conductor 78 in the insulative body 62.

When the probe 122 deviates from the center of the supporter 70, the lateral elasticity of the helical spring will pull the probe 122 back to central position automatically, i.e., the helical spring can limit and restrict the probe 122 to move substantially only in the vertical direction. In addition, even if there is difference in length between the probes 122, the longitudinal elasticity of the supporter 70 can reduce the difference between the stresses applied to the pads 54 by the probes 122 when contacting the device under test 52.

Figure 7:
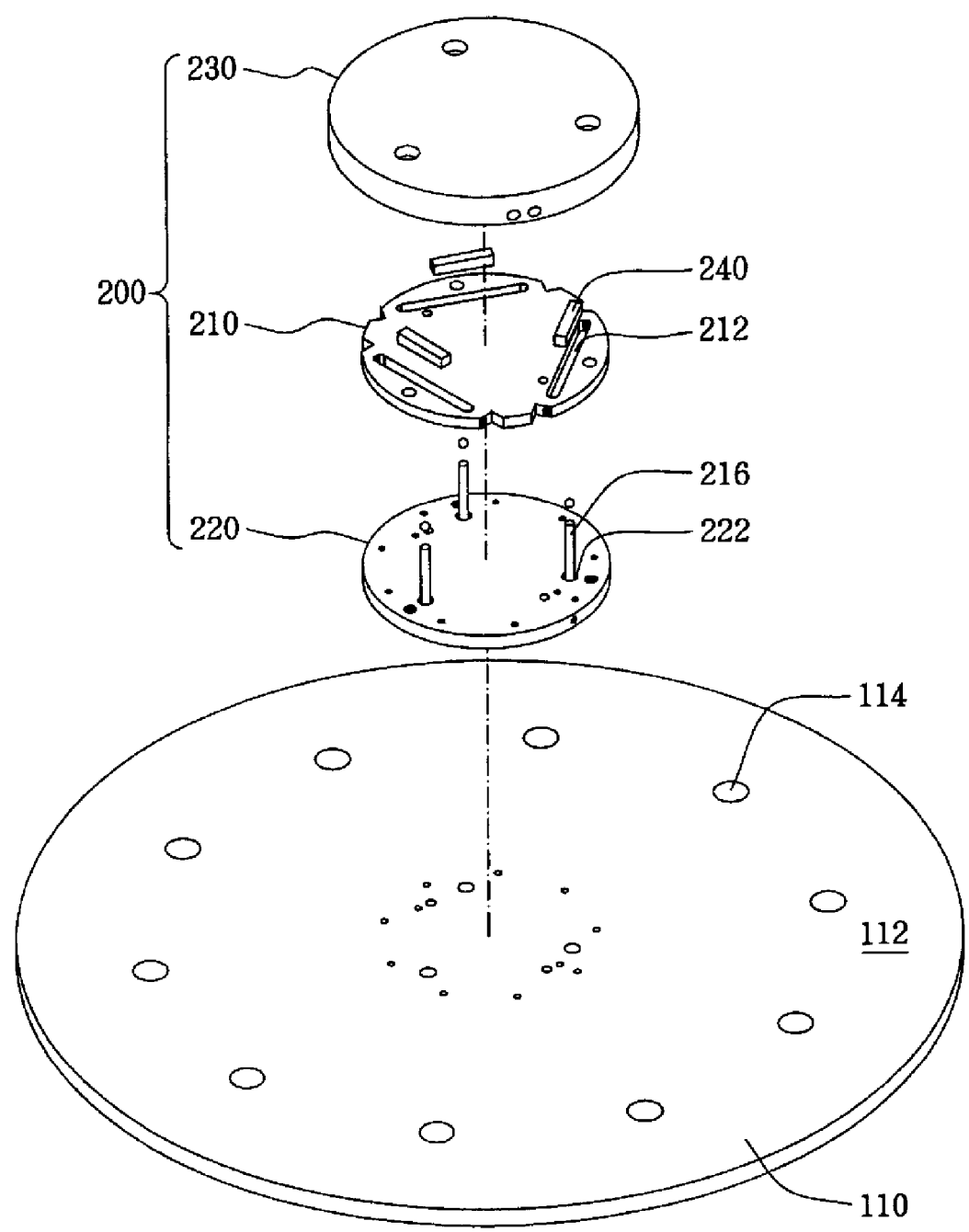
FIG. 7 and FIG. 8 illustrate an adjusting assembly according to the present invention.
Figure 8:
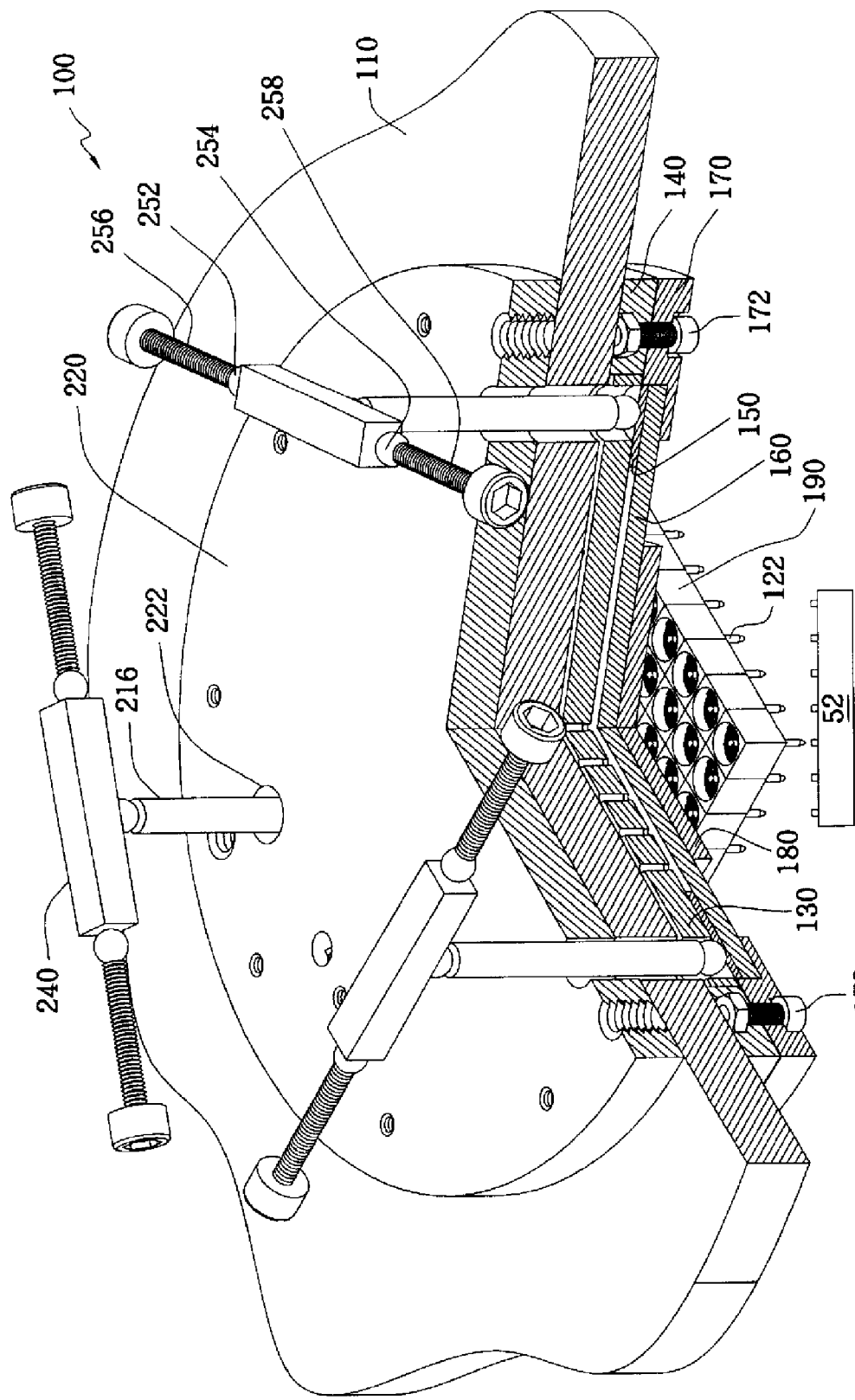

FIG. 7 and FIG. 8 illustrate the adjusting assembly 200 according to the present invention. The adjusting assembly 200 comprises an upper cover 230, a groove plate 210 with three grooves 212, a wedge 240 positioned in the groove 212, an adjusting pin 216 with two ends contacting the wedge 240 and the probe assembly 120, and a guiding plate 220 for guiding the moving direction of the adjusting pin 216. The guiding plate 220 has a plurality of openings 222, and the adjusting pin 216 is positioned in the opening 222. One end of the pin 216 contacts the wedge 240, while the other end contacts the stress dispersion plate 150 of the probe assembly 120 through spheres.

Figure 9:
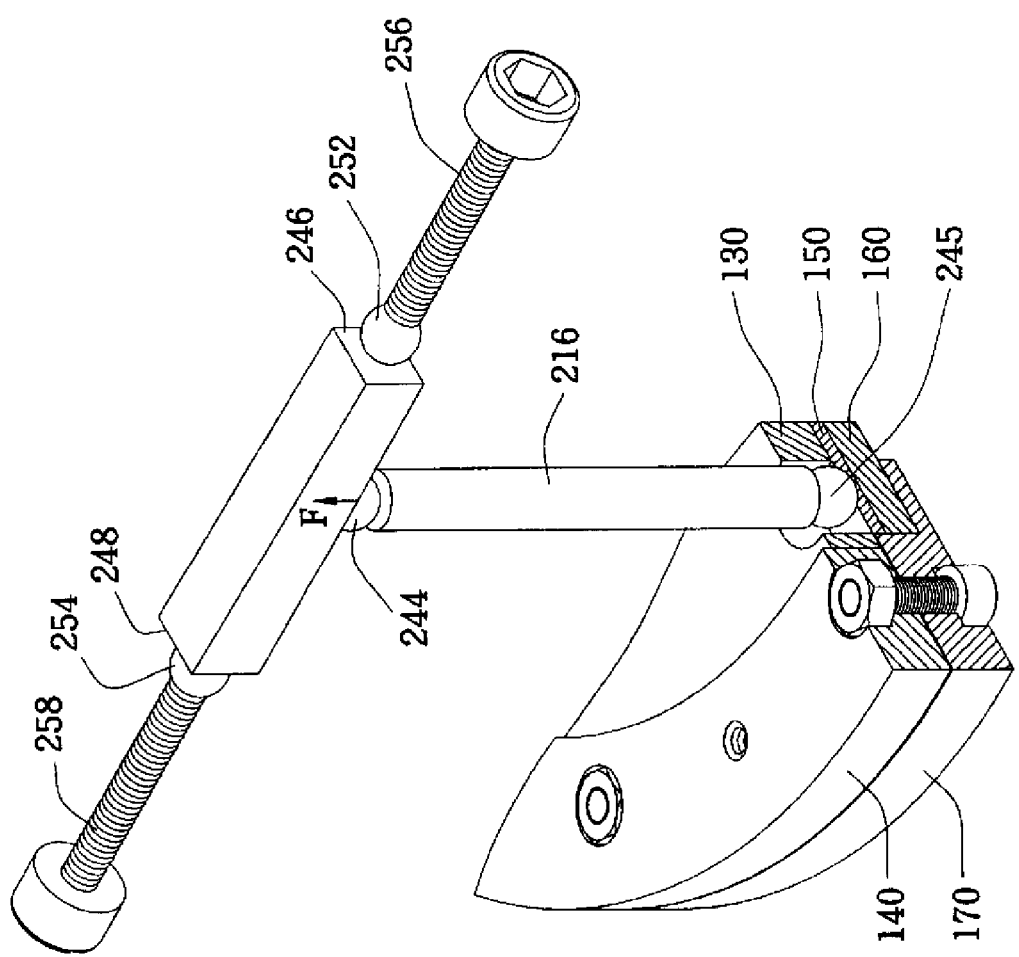
FIG. 9 and FIG. 10 show the operation of a wedge, an adjusting pin and a stress dispersion plate according to the present invention.
Figure 10:
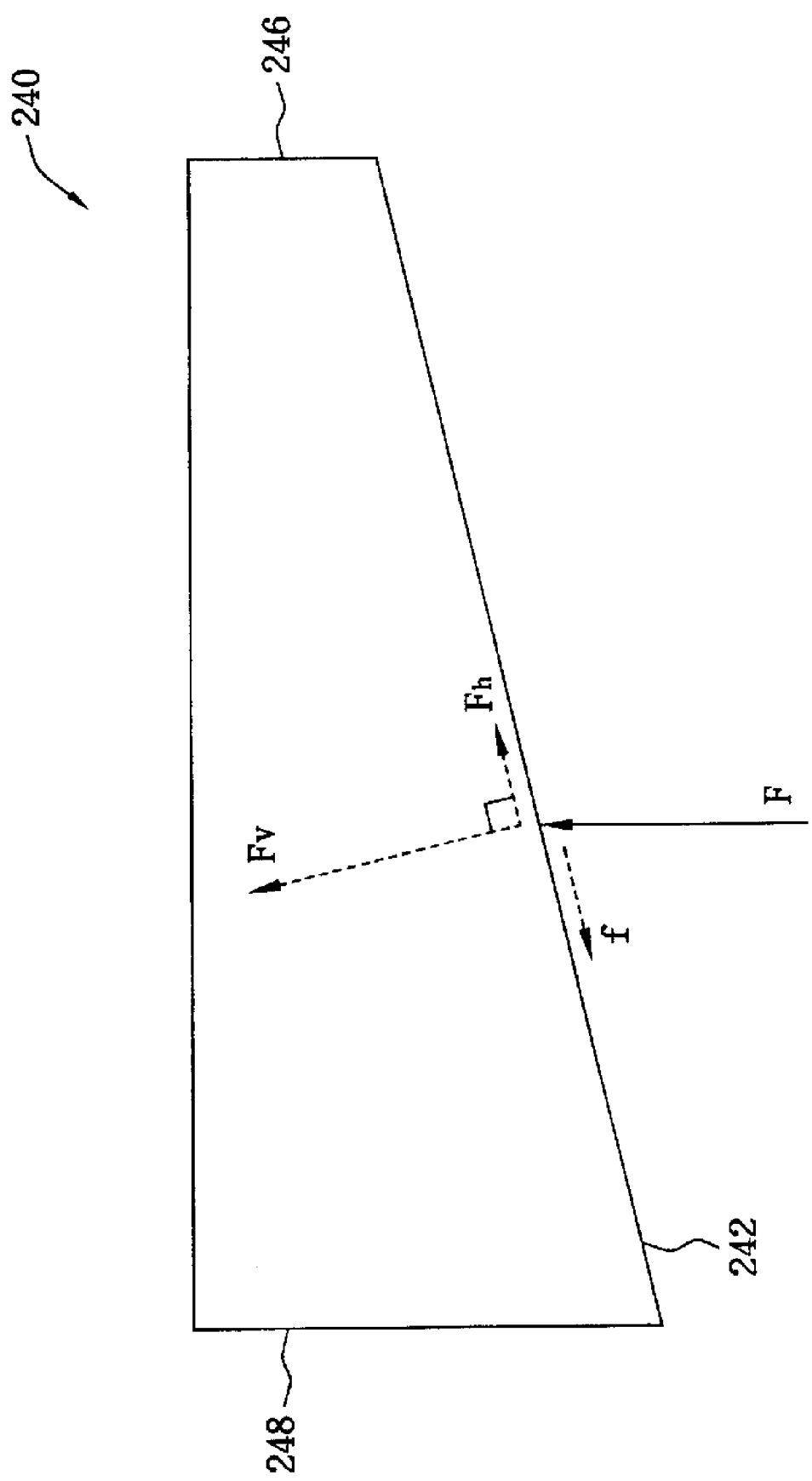

FIG. 9 and FIG. 10 illustrate the operation of the wedge 240, the adjusting pin 216 and the stress dispersion plate 150 according to the present invention. The wedge 240 has an inclined surface 242, and the adjusting pin 216 contacts the inclined surface 242 through a sphere 244 and contacts the stress dispersion plate 150 through another sphere 245. Since the adjusting pin 216 does not contact the interface circuit board 160 directly, but contact the stress dispersion plate 150 via the sphere 245, the mechanical stress induced by the adjusting pin 216 via the sphere 245 is dispersed by the stress dispersion plate 150 to prevent the interface circuit board 160 from being damaged by excessively concentrated stress directly induced from the force exerted by adjusting pin 216.

Two screws 256, 258 contact the two sides 246 and 248 of the wedge 240 through two spheres 252 and 254, respectively. Rotating the screws 256, 258 moves the wedge 240 laterally, which push the adjusting pin 216 to move upwards and downwards via the inclined surface 242 to further move the stress dispersion plate 150 upwards and downwards. If the wedge 240 is 20 mm in width and there is a 0.5 mm difference in thickness between two sides 246 and 248, the slope of the inclined plane 242 is 0.025. If the pitches of the screws 256, 258 is 0.5 mm, rotating the screws 256, 258 one turn will move the adjusting pin 216 vertically by a distance of 0.025×0.5=0.0125 mm. Consequently, the present invention can adjust the planarity of the probe assembly 120 easily, i.e. adjust the coplanarity between the probe assembly 120 and the device under test 52 through the movements of the wedges 240 with an appropriate inclined surface and screws 256, 258 with an appropriate pitch.

Please refer to FIG. 10, when the probe 122 contacts the device under test 52, the probe contact force (F) resulted during testing the device under test 52 will be transmitted to the adjusting pin and finally the force will be exerted on the inclined surface 242 of the wedge 240. The contact force (F) can equivalently be divided into two component forces, namely a vertical component force ($F_v$) perpendicular to the inclined surface 242, and a horizontal component force ($F_h$) parallel to the inclined surface 242. The horizontal component force ($F_h$) tends to change the horizontal position of the wedge 240, in another words, it will shift the horizontal position of the inclined surface 242 and finally causes the planarity of the probe assembly 120 to change from its original intended orientation. Moreover, the vertical component force ($F_v$) which then representing the normal force (N) is applied to the inclined surface 242, and physically generates a friction force $f=F_v \times \mu$ ($\mu$: coefficient of friction of the inclined surface 242) which is acting on the inclined surface 242, wherein the direction of the friction force (f) is opposed to that of the horizontal component force ($F_h$). Consequently, the inclined surface 242 with an appropriate coefficient of friction will generate a friction force to counteract the horizontal component force ($F_h$) and lock the lateral position of the adjusting pin 216 automatically so that the coplanarity between the probe assembly 120 and the device under test 52 will be maintained.

Please refer to FIG. 8, the included angle between two of the three pins 216 is 120 degrees, and the two ends of the adjusting pin 216 contacts the inclined surface 242 of the wedge 240 and the stress dispersion plate 150 of the probe assembly 120, respectively. The bottom cover 170 is fixed on the spacer 140 by three screws 172, and the positions of the three screws 172 correspond to that of the three adjusting pins 216, respectively. When adjusting the coplanarity between the probe assembly 120 and the device under test 52, the screws 172 are loosen at first, then rotating the screws 256, 258 a predetermined turn to move the three wedges 240 by a predetermined distance laterally, and the three adjusting pins 216 are further moved upwards and downwards to adjust the orientation of the stress dispersion plate 150. Finally, the screws 172 are tightened to fix the probe assembly 120 onto the spacer 140.

Figure 11:
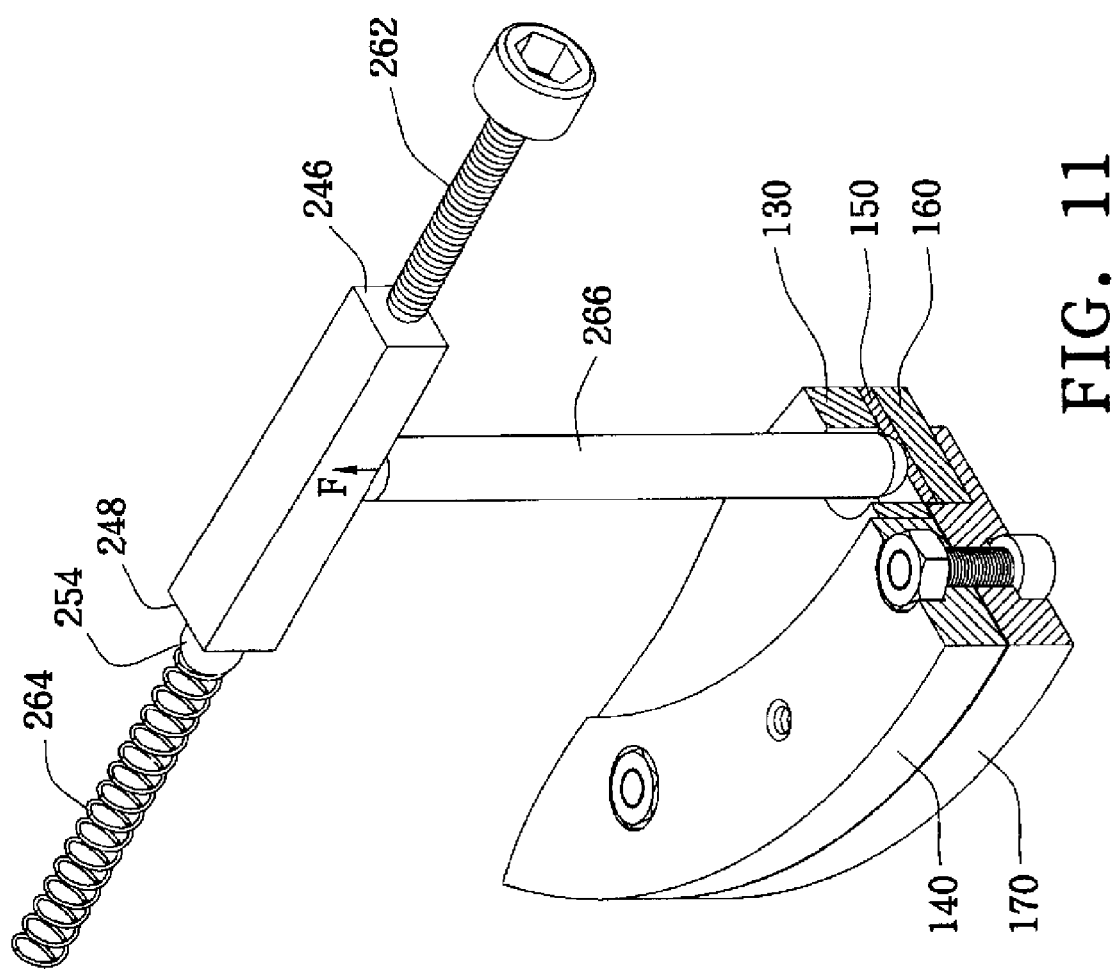
FIG. 11 illustrates the operation of the wedge according to the present invention.

FIG. 11 shows another operating mode of the wedge 240 according the present invention. The adjusting pins 216 in FIG. 9 are connected to the wedge 240 and the stress dispersion plate 150 via the spheres 244 and 245 at the ends, respectively. On the contrary, the two ends of the adjusting pin 266 in FIG. 11 are semi-circular and can contact the wedge 240 and the stress dispersion plate 150 directly without using the spheres 244 and 245. In addition, the embodiment shown in FIG. 9 uses two screws 256, 258 to contact the two sides 246 and 248 of the wedge 240 via spheres 252 and 254, respectively, while the embodiment shown in FIG. 11 uses a screw 262 and a spring 264 to contact the two sides 246 and 248 of the wedge 240, respectively. One end of the screw 262 is semi-circular, so it can contact the side 246 of the wedge 240 directly without using the sphere 252. The spring 264 can contact the side 248 directly or by the sphere 254. Furthermore, the present invention can optionally use another screw, i.e., using two screws 262 rather than one screw 262 and one spring 264, to contact the two sides 246 and 248 without using two spheres 252 and 254.

Figure 12:
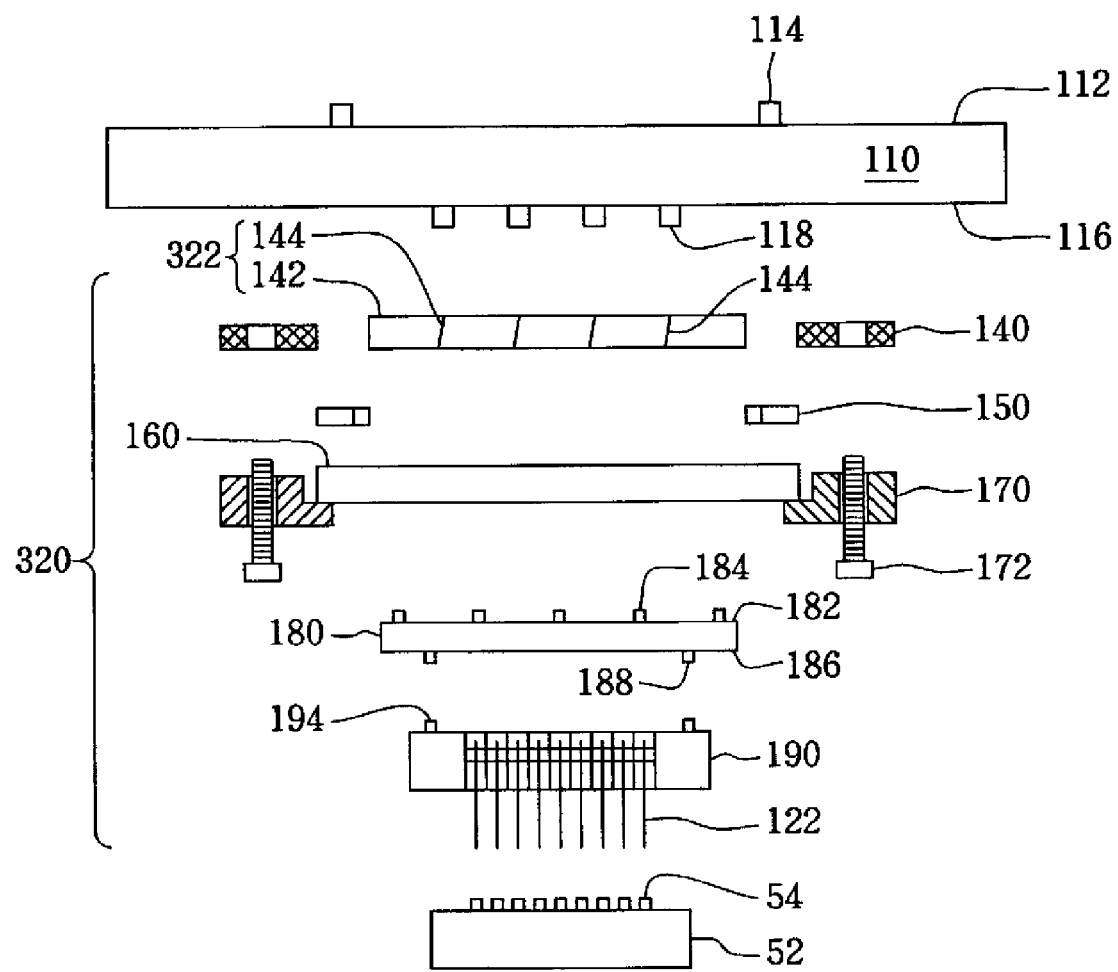
FIG. 12 illustrates a probe assembly according to another embodiment of the present invention.

FIG. 12 illustrates a probe assembly 320 according to another embodiment of the present invention. The elastic connector 130 shown in FIG. 3 electrically connects the primary circuit board 110 and the interface circuit board 160 via the elastic pin 134 in the opening 132, and counteracts the contact force applied by the primary circuit board 110 and the interface circuit board 160 by means of the elasticity of the elastic pin 134. On the contrary, the elastic connector 322 shown in FIG. 12 electrically connects the primary circuit board 110 and the interface circuit board 160 via an elastic plate 142 and a plurality of conductors (conductive wires) 144 positioned inside the elastic plate 142. The elastic plate 142 is made up of elastomer such as silicon rubber, and the conductor 144 is positioned in the elastic plate 142 in an inclined manner for electrical connecting the signal contacts 118 and the probes 122.

The elastic plate 142 will deform elastically to eliminate the resulted mechanical stress by the primary circuit board 110 and the interface circuit board 160, and the conductor 144 will become more further inclined from initial inclined state. On the contrary, if the conductor 144 were positioned in the elastic plate 142 vertically, the vertical conductor 144 would be bent, rather than become more inclined, to counteract the applied force when the primary circuit board 110 and the interface circuit board 160 applied a force from both ends of the conductor 144. Since frequent bending of the conductive path will cause open circuit, the conductor 144 is positioned in an inclined manner according to the present invention. Consequently, when the primary circuit board 110 and the interface circuit board 160 applies a force, the conductor 144 will become more inclined rather than bend to avoid the occurrence of the open circuit originating from the bending of the conductive path.

Figure 13:
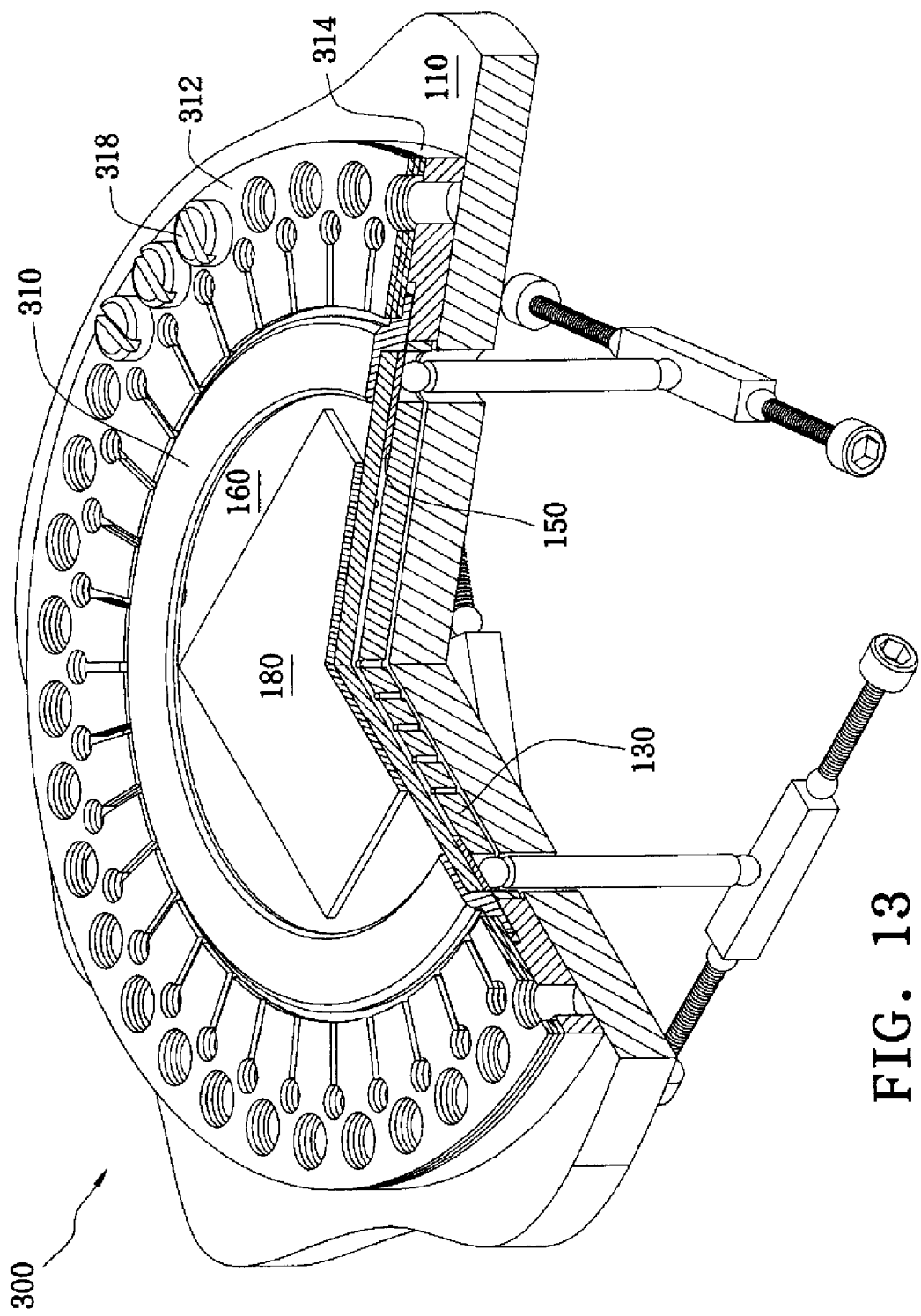
FIG. 13 illustrates an integrated circuit probe card according to the present invention.

FIG. 13 illustrates an integrated circuit probe card 300 according to the second embodiment of the present invention. The bottom cover 310 of the integrated circuit probe card 300 also supports the interface circuit board 160, the stress dispersion plate 150 and the elastic connector 130. Compared with the bottom cover 170 fixed onto the spacer 140 directly by the screw 172 as shown in FIG. 8, the bottom cover 310 of the integrated circuit probe 300 shown in FIG. 11 is fixed on the spacer plate 314 via a plurality of spring steels 312, which are further fixed on the spacer plate 314 directly via the screw 318. Since the elasticity of the spring steels 312 can provide an appropriate moving space, the coplanarity between the space transformer 180 and the device under test 52 can be adjusted without releasing the screw 318 in advance.

Compared with prior art, the present integrated circuit probe card 100 possesses the following advantages:

Different from the prior art using the vertical movement of differential screws to adjust the planarity, the present invention adjusts the coplanarity between the probe assembly 120 and the device under test 52 by the lateral movement of the wedge 240 by rotating screws 256, 258.

The present invention can adjust the coplanarity between the probe assembly 120 and the device under test 52 easily by the wedge 240 with an appropriate inclined surface 242 and screws 256, 258 with an appropriate pitch.

The contact force (F) applied to the probe 122 by the device under test 52 is partially transferred to the inclined surface 242 of the wedge 240, and the direction of the friction force (f) generated by both the vertical component force ($F_v$) of the contact force (F) and the inclined surface 242 is opposite to that of the horizontal component force ($F_h$) of the force (F). Consequently, a friction force will be generated on the inclined surface 242 with an appropriate coefficient of friction to counteract with the horizontal component force ($F_h$) and lock the lateral position of the adjusting pin 216 automatically, so that the coplanarity between the probe assembly 120 and the device under test 52 will be maintained.

The above-described embodiments of the present invention are intended to be illustrative only. Numerous alternative embodiments may be devised by those skilled in the art without departing from the scope of the following claims.

What is claimed as new and desired to be protected by Letters Patent of the United States is:

1. An integrated circuit probe card, comprising:
   a primary circuit board with a plurality of signal contacts;
   a probe assembly including a plurality of probes electrically connected to the signal contacts; and
   an adjusting assembly comprising a wedge for adjusting the coplanarity between the probe assembly and an integrated circuit device under test a groove plate having a plurality of grooves, and an adjusting pin with two ends connected to the wedge and the probe assembly.

2. The integrated circuit probe card according to claim 1, wherein the adjusting assembly further comprises at least one screw connected to one side of the wedge for moving the wedge by rotation.

3. The integrated circuit probe card according to claim 2, wherein the screw contacts the side of the wedge through a sphere.

4. The integrated circuit probe card according to claim 2, wherein one end of the screw is semi-circular to contact the side of the wedge.

5. The integrated circuit probe card according to claim 2, wherein the adjusting assembly further comprises a spring positioned on another side of the wedge.

6. The integrated circuit probe card according to claim 1, wherein the adjusting assembly further comprises a guiding plate with a plurality of openings, and the adjusting pin is positioned in the opening.

7. The integrated circuit probe card according to claim 1, wherein one end of the adjusting pin contacts an inclined surface of the wedge through a sphere.

8. The integrated circuit probe card according to claim 1, wherein one end of the adjusting pin is semi-circular.

9. An integrated circuit probe card, comprising:
   a primary circuit board with a plurality of signal contacts;
   a probe assembly, comprising:
   a plurality of probes for acquiring electrical properties of an integrated circuit device under test; and
   an elastic connector electrically connected to the signal contacts and the probes;
   a space transformer including an upper surface with a plurality of upper connection sites thereon for connecting the signal contacts of the primary circuit board;
   a bottom surface with a plurality of bottom connection sites thereon for electrical connecting the probes;
   an interface circuit board for electrical connecting the signal contacts of the primary circuit board and the upper connection sites of the space transformer; and
   an adjusting assembly for adjusting the coplanarity between the probe assembly and the integrated circuit device under test, the adjusting assembly comprising:
   a groove plate with a plurality of grooves;
   a wedge positioned in the groover; and
   at least one adjusting pin with two ends connecting the wedge and the probe assembly.

10. The integrated circuit probe card according to claim 9, further comprising:
    a spacer positioned on a bottom surface of the primary circuit board; and a bottom cover positioned on the spacer for supporting the probe assembly.

11. The integrated circuit probe card according to claim 9, further comprising:
    a spacer positioned on the bottom surface of the primary circuit board;
    a bottom cover for supporting the probe assembly; and
    at least one spring sheet positioned on the spacer for supporting the bottom cover.

12. The integrated circuit probe card according to claim 9, wherein the adjusting assembly further comprises a guiding plate with a plurality of openings, and the adjusting pin is positioned in the opening.

13. The integrated circuit probe card according to claim 9, wherein one end of the adjusting pin contacts an inclined surface of the wedge through a sphere.

14. The integrated circuit probe card according to claim 9, further comprising a stress dispersion plate positioned on the relay circuit board, wherein the adjusting pin contacts the stress dispersion plate through a sphere.

15. The integrated circuit probe card according to claim 9, wherein one end of the adjusting pin is semi-circular.

16. The integrated circuit probe card according to claim 9, wherein the adjusting assembly further comprises at least one screw connected to one side of the wedge for moving the wedge by rotation.

17. The integrated circuit probe card according to claim 16, wherein the screw contacts the side of the wedge through a sphere.

18. The integrated circuit probe card according to claim 16, wherein one end of the screw is semi-circular to contact the side of the wedge.

19. The integrated circuit probe card according to claim 16, wherein the adjusting assembly further comprises a spring positioned at another side of the wedge.

20. The integrated circuit probe card according to claim 9, wherein the elastic connector comprises:
fixing plate with a plurality of openings; and
an elastic pin positioned in the opening for electrical connecting the signal contact of the primary circuit board and the probe of the probe assembly.

21. The integrated circuit probe card according to claim 20, wherein the elastic pin comprises:
a housing;
a spring with two ends positioned in the housing; and
two connecting pins connected to the two ends of the spring.

22. The integrated circuit probe card according to claim 9, wherein the elastic connector comprises:
an elastic plate; and
a plurality of conductive wires positioned in the elastic plate in an inclined manner for electrical connecting the signal contacts of the primary circuit board and the probes of the probe assembly.

23. The integrated circuit probe card according to claim 22, wherein the elastic plates is made of silicon rubber.

24. An integrated circuit probe card, comprising:
a primary circuit board with a plurality of signal contacts:
a probe assembly, comprising:
a plurality of probes for acquiring electrical properties of an integrated circuit device under test; and
an elastic connector electrically connected to the signal contacts and the probes; and
an adjusting assembly for adjusting the coplanarity between the probe assembly and the integrated circuit device under test, the adjusting assembly comprising:
a groove plate with a plurality of grooves;
a wedge positioned in the groove; and
at least one adjusting pin with two ends connecting the wedge and the probe assembly.

* * * * *